(12) United States Patent
Matsumoto et al.

(10) Patent No.: US 11,454,836 B2
(45) Date of Patent: Sep. 27, 2022

(54) LASER PROCESSING APPARATUS AND LASER PROCESSING METHOD

(71) Applicant: Via Mechanics, Ltd., Kanagawa (JP)

(72) Inventors: Kazuya Matsumoto, Kanagawa (JP); Kazuo Watanabe, Kanagawa (JP); Atsushi Sakamoto, Kanagawa (JP); Masanori Sato, Kanagawa (JP); Mitsuru Kato, Kanagawa (JP); Masaru Kikuchi, Kanagawa (JP)

(73) Assignee: VIA MECHANICS, LTD., Kanagawa (JP)

( * ) Notice: Subject to any disclaimer, the term of this patent is extended or adjusted under 35 U.S.C. 154(b) by 449 days.

(21) Appl. No.: 16/447,474

(22) Filed: Jun. 20, 2019

(65) Prior Publication Data

US 2020/0004057 A1    Jan. 2, 2020

(30) Foreign Application Priority Data

Jun. 29, 2018 (JP) .............................. JP2018-123796
Jun. 17, 2019 (JP) .............................. JP2019-111802

(51) Int. Cl.
*G02F 1/11* (2006.01)
*H01S 3/00* (2006.01)
(Continued)

(52) U.S. Cl.
CPC ............ *G02F 1/113* (2013.01); *B23K 26/382* (2015.10); *H01S 3/0071* (2013.01); *H05K 3/0044* (2013.01); *H05K 2203/107* (2013.01)

(58) Field of Classification Search
CPC .... B23K 26/08; B23K 26/082; B23K 26/352; B23K 26/36; B23K 26/38; B23K 26/382;
(Continued)

(56) References Cited

U.S. PATENT DOCUMENTS

2003/0164358 A1*  9/2003  Ward ................. B23K 26/08
                                                 219/121.7
2008/0031291 A1    2/2008  Kobayashi et al.
(Continued)

FOREIGN PATENT DOCUMENTS

CN    102481664 A    5/2012
JP    5122773 B2    1/2013
TW    201434563 A    9/2014

OTHER PUBLICATIONS

Chinese Office Action for Application No. 201910575115.6, dated Dec. 2, 2021.
(Continued)

*Primary Examiner* — Erin E McGrath
(74) *Attorney, Agent, or Firm* — Nixon Peabody LLP; Thomas P. Pavelko (57) ABSTRACT

A laser processing apparatus disclosed in the present application includes: an optical deflection unit capable of changing a deflection direction of and outgoing energy of an incoming laser pulse by changes of a frequency of and an amplitude of a driving signal to be supplied; and a control unit configured to supply driving signals with amplitudes corresponding to respective frequencies. In a laser processing apparatus configured to process a workpiece by leading outgoing laser pulse of the optical deflection unit to the workpiece and irradiating the workpiece with the laser pulse, as the amplitude corresponding to each of the frequencies, the control unit supplies an amplitude having the ratio that is close to the lowest ratio among ratios of the outgoing energy with respect to the incoming energy of the laser pulse at an amplitude having the largest outgoing energy of the optical deflection unit.

5 Claims, 6 Drawing Sheets (51) Int. Cl.
*B23K 26/382* (2014.01)
*H05K 3/00* (2006.01)
(58) Field of Classification Search
CPC .. B23K 26/384; B23K 26/386; B23K 26/388; B23K 26/389; G02F 1/113
See application file for complete search history.

(56) References Cited

U.S. PATENT DOCUMENTS

2010/0301023 A1   12/2010  Unrath et al.
2014/0197140 A1    7/2014  Unrath

OTHER PUBLICATIONS

TW Office Action for Application No. 108122572, dated Jul. 6, 2022, 6 pp.
TW Search Report for Application No. 108122572, dated Jul. 6, 2022, 2 pp.

* cited by examiner

| POSITION IN X DIRECTION | FREQUENCY | α | β | γ |
|---|---|---|---|---|
| x1 | f1 | u-α1 | u-β1 | u-γ1 |
| x2 | f2 | u-α2 | u-β2 | u-γ2 |
| x3 | f3 | u-α3 | u-β3 | u-γ3 |
| x4 | f4 | u-α4 | u-β4 | u-γ4 |
| ⋮ | ⋮ | ⋮ | ⋮ | ⋮ |
| xn | fn | u-αn | u-βn | u-γn |
| ⋮ | ⋮ | ⋮ | ⋮ | ⋮ |

(WHEN FREQUENCY OF RF SIGNAL IS f1)

| AMPLITUDE | $\alpha$ | $\beta$ | $\gamma$ |
|---|---|---|---|
| a1 | v-$\alpha$1 | v-$\beta$1 | v-$\gamma$1 |
| a2 | v-$\alpha$2 | v-$\beta$2 | v-$\gamma$2 |
| a3 | v-$\alpha$3 | v-$\beta$3 | v-$\gamma$3 |
| a4 | v-$\alpha$4 | v-$\beta$4 | v-$\gamma$4 |
| ⋮ | | | |
| am | v-$\alpha$m | v-$\beta$m | v-$\gamma$m |
| ⋮ | | | |

| POSITION IN X DIRECTION | FREQUENCY | AMPLITUDE |
|---|---|---|
| X1 | f1 | am |
| X2 | f2 | an |
| X3 | f3 | ap |
| X4 | f4 | as |
| ⋮ | ⋮ | |

LASER PROCESSING APPARATUS AND LASER PROCESSING METHOD

CROSS-REFERENCE TO RELATED APPLICATION

The present application claims priority from Japanese Patent Applications No. 2018-123796 filed on Jun. 29, 2018, and No. 2019-111802 filed on Jun. 17, 2019, the contents of which are hereby incorporated by reference into this application.

TECHNICAL FIELD OF THE INVENTION

The present invention relates to, for example, a laser processing apparatus and a laser processing method to hole a printed board by using laser.

BACKGROUND OF THE INVENTION

As a laser processing apparatus using a laser oscillator, a laser processing apparatus changing a laser irradiation position by using an audio optical device (abbreviated as "AOD" below) having a high operation speed has been known. Such an AOD is controlled by an RF signal supplied from an AOD control unit, and a deflection angle is determined by a frequency of the RF signal while outgoing energy is determined by an amplitude of the RF signal. The AOD has characteristics changing the outgoing energy on the basis of the deflection angle. Therefore, for example, Japanese Patent No. 5122773 (Patent Document 1) discloses a technique of controlling the AOD on the basis of a previously-prepared control table in which control information for providing the amplitude corresponding to the frequency of the RF signal is registered in order to keep the outgoing energy constant even when the deflection angle changes.

An example of a related-art method of preparing the control table and a usage method of the control table will be described as follows. The laser pulse from the laser oscillator is applied to the AOD to cause deflection, and the outgoing energy at this time is detected. This operation is repeated at each frequency of the RF signal determining the deflation angle, and the minimum level of the outgoing energy in the repeated operations is previously detected. Next, a control table used for registering the control information at each frequency of the RF signal determining the deflation angle is prepared, the control information being used for determining the amplitude of the RF signal so as to output the outgoing energy of the minimum level, and the control table is registered in a memory inside an overall control unit controlling a processing operation. When a workpiece such as a printed board is practically holed, data for determining the amplitude corresponding to the frequency is read out from the control table, and the deflection angle of and the output energy of the AOD are controlled.

The related-art method of preparing the control table as described above is made from an assumption that the energy of the laser pulse output from the laser oscillator is constant. During supply of an RF signal with a certain frequency at a stage of the preparation of the control table, even if the energy of the laser pulse output from the laser oscillator accidentally increases or decreases, the control table is prepared on the basis of the increase/decrease. As a result, the AOD is controlled by an incorrect control table, and therefore, there are problems in a hole quality so that a processed hole diameter is small or the hole does not penetrate through.

SUMMARY OF THE INVENTION

Accordingly, an object of the present invention is to ensure the hole quality by suppressing the preparation of the control information for the AOD from being affected even by the change of the energy of the laser pulse output from the laser oscillator at the stage of the preparation.

In order to solve the above-described problems, a typical laser processing apparatus disclosed in the present application includes: an optical deflection unit capable of changing a deflection direction of and outgoing energy of an incoming laser pulse by changes of a frequency of and an amplitude of a driving signal to be supplied; and a control unit configured to supply driving signals with amplitudes corresponding to respective frequencies. In a laser processing apparatus configured to process a workpiece by leading outgoing laser pulse of the optical deflection unit to the workpiece and irradiating the workpiece with the laser pulse, as the amplitude corresponding to each of the frequencies, the control unit supplies an amplitude having the ratio that is close to the lowest ratio among ratios of the outgoing energy with respect to the incoming energy of the laser pulse at an amplitude having the largest outgoing energy of the optical deflection unit.

According to the present invention, even if the energy of the laser pulse output from the laser oscillator changes at the stage of the preparation of the control information for the AOD, the preparation can be prevented from being affected by the change, and the hole quality can be ensured.

DESCRIPTIONS OF THE PREFERRED EMBODIMENTS

Hereinafter, embodiments of the present invention will be described with reference to the accompanying drawings.

First Example

Figure 2:
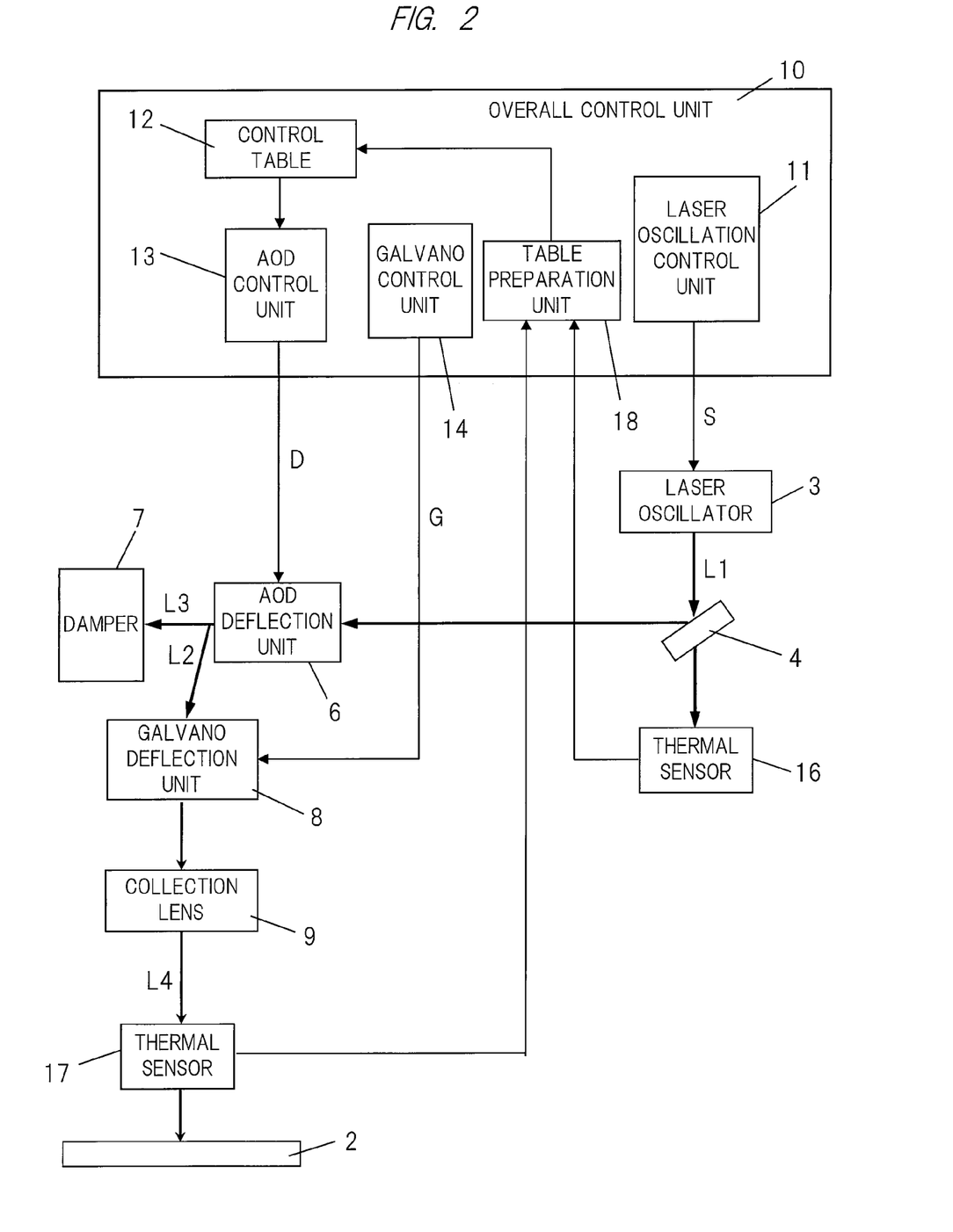
FIG. 2 is a structural block diagram of the laser processing apparatus according to the first example of the present invention.

FIG. 2 is a block diagram of the laser processing apparatus according to a first example of the present invention.

Each of components and connecting lines that may be necessary for explaining the present example is mainly illustrated, and all elements that are necessary in the laser processing apparatus are not illustrated.

The laser processing apparatus described here holes a printed board. However, the present invention is not limited to this operation, and this may be a laser processing apparatus allowing a beam splitter or others to disperse light into reflected light and transmitted light to process a plurality of portions of a workpiece. In FIG. 2, "2" indicates a table on which a printed board to be processed is placed, "3" indicates a laser oscillator that oscillates a laser pulse L1, "4" indicates a beam splitter that disperses the laser pulse L1 going out of the laser oscillator 3 into reflected light and transmitted light, "6" indicates an AOD deflection unit that two-dimensionally deflects the laser pulse L1 reflected in the beam splitter by using an AOD, "7" indicates a damper that absorbs a laser pulse L3 not deflected in a processing direction but transmitted in the AOD deflection unit 6, "8" indicates a galvano deflection unit that two-dimensionally deflects a laser pulse L2 deflected in the processing direction in the AOD deflection unit 6 by using a galvano mirror, and "9" indicates a collection lens that irradiates a portion to be holed on the printed board with a laser pulse from the galvano deflection unit 8. Note that the AOD deflection unit 6 is configured of two AOD that are an AOD deflecting the incoming light in an X direction and an AOD deflecting the outgoing light of the AOD in a Y direction, and the galvano deflection unit 8 is configured to totally have the same configuration.

Figure 3:
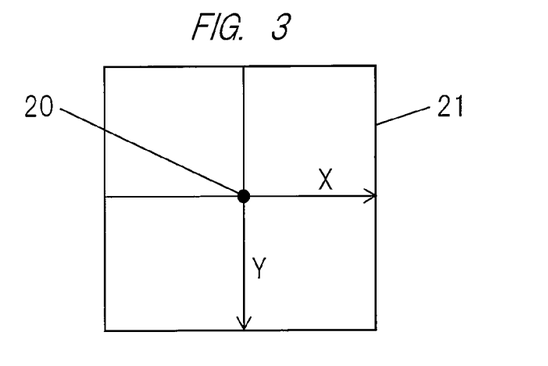
FIG. 3 is a diagram for explaining a role of a galvano deflection unit and an AOD deflection unit in the laser processing apparatus of FIG. 2.

In this laser processing apparatus, a scan region of the galvano deflection unit 8 is sequentially moved by movement of the table 2. The galvano deflection unit 8 is used for positioning the laser pulse at a specific position of the scan region, and the AOD deflection unit 6 is used for positioning the laser pulse in a high speed at a peripheral position centering the specific position. A relation between the specific position and the peripheral position is shown in FIG. 3. In FIG. 3, "20" indicates the specific position, and "21" indicates a region becoming the peripheral position. For example, trepanning processing is achieved by such laser irradiation as positioning the laser at the specific position 20, and then, positioning the laser at the peripheral position.

The description returns to FIG. 2. "10" indicates an overall control unit for controlling an operation of the entire apparatus, that is configured so that a processing device for program control is centrally arranged. Each of components and connecting lines in the device includes logical ones. Some of the components may be separately arranged from the unit. The overall control unit 10 has control functions other than those described here, and is also connected to a block not illustrated.

The overall control unit 10 includes, inside itself, a laser oscillation control unit 11 that outputs a laser oscillation order signal "S" for ordering oscillation and damping of the laser pulse L1 in the laser oscillator 3, a control table 12 in which the control information for controlling the AOD is registered, an AOD control unit 13 that outputs an AOD driving signal "D" for controlling the AOD in accordance with a content of the control table 12, and a galvano control unit 14 that outputs a galvano control signal "G" for controlling the galvano deflection unit. The AOD control unit 13 and the galvano control unit 14 control two deflection units that are the AOD deflection unit 6 and the galvano deflection unit 8 in an X system and a Y system, respectively. Although only one control table 12 is shown, two control tables in the X system and the Y system are arranged.

Figure 4:
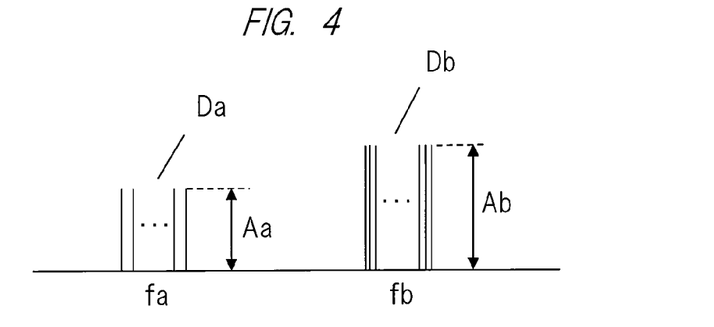
FIG. 4 is a diagram showing an example of an RF signal in the laser processing apparatus of FIG. 2.

Each of the AOD driving signals "D" output from the AOD control unit 13 is made of the RF signal, a deflection angle of the AOD deflection unit 6 is changed by a frequency of the RF signal, and the outgoing energy is changed by an amplitude level of this RF signal. FIG. 4 shows an example of the AOD driving signals D in which AOD driving signals "Da" and "Db" have frequencies "fa" and "fb" and amplitudes "Aa" and "Ab". The frequency fb is higher than the frequency fa, and the amplitude Ab is larger than the amplitude Aa. When the AOD driving signal Db is applied, the deflection angle of and the outgoing energy of the AOD deflection unit 6 are larger than those when the AOD driving signal Da is applied. Although described later, as the control table 12, data for determining the amplitude to be supplied at this time is registered in a memory at each frequency of the RF signal to be supplied to the AOD.

The laser processing apparatus described here is configured as follows, in order to prepare the control table 12 on the basis of the present invention. As shown in FIG. 2, a thermal sensor 16 that outputs a detection signal corresponding to average power of the laser pulse transmitted through the beam splitter 4 and a thermal sensor 17 that outputs a detection signal corresponding to average power of the laser pulse L4 going out of the collection lens 9 are attached. The thermal sensors 16 and 17 are used for detecting the average power of the laser pulse as heat, and these detection signals are input in the table preparation unit 18.

In this description, note that a method of detecting the average power by using the thermal sensors is applied for detecting the energy of the laser pulse. However, the energy may be detected by a different method. In this description, the energy of the laser pulse L1 going out of the laser oscillator 3 may be detected through the beam splitter 4. However, the energy of the laser pulse L1 may be detected by a different method.

A method of preparing the control table 12 by using the table preparation unit 18 will be described below. When the control table 12 of the X system is prepared, the frequency of the RF signal to be supplied to the AOD of the Y system is fixed while the frequency of the RF signal to be supplied to the X system is sequentially switched by the AOD control unit 13. On the other hand, when the control table 12 of the Y system is prepared, the frequency of the RF signal to be supplied to the AOD of the X system is fixed while the frequency of the RF signal to be supplied to the Y system is sequentially switched by the AOD control unit 13.

When the control table 12 of the X system is prepared, the frequency of the RF signal to be supplied to the AOD of the X system is fixed while the amplitude of the RF signal is sequentially switched. On the other hand, when the control table 12 of the Y system is prepared, the frequency of the RF signal to be supplied to the AOD of the Y system is fixed while the amplitude of the RF signal is sequentially switched.

The galvano deflection unit 8 positions the laser pulse L2 from the AOD deflection unit 6 at a position near the center of the scan region, that is, near the center of the collection lens 9. This manner can avoid adverse effect based on variation of a transmittance due to the laser incoming position on the collection lens 9. The laser irradiation position is moved in the X direction of FIG. 3 by the sequential switching of the frequency of the RF signal to be supplied to the X system, and the laser irradiation position is moved in the Y direction of FIG. 3 by the sequential switching of the frequency of the RF signal to be supplied to the Y system.

Figure 1:
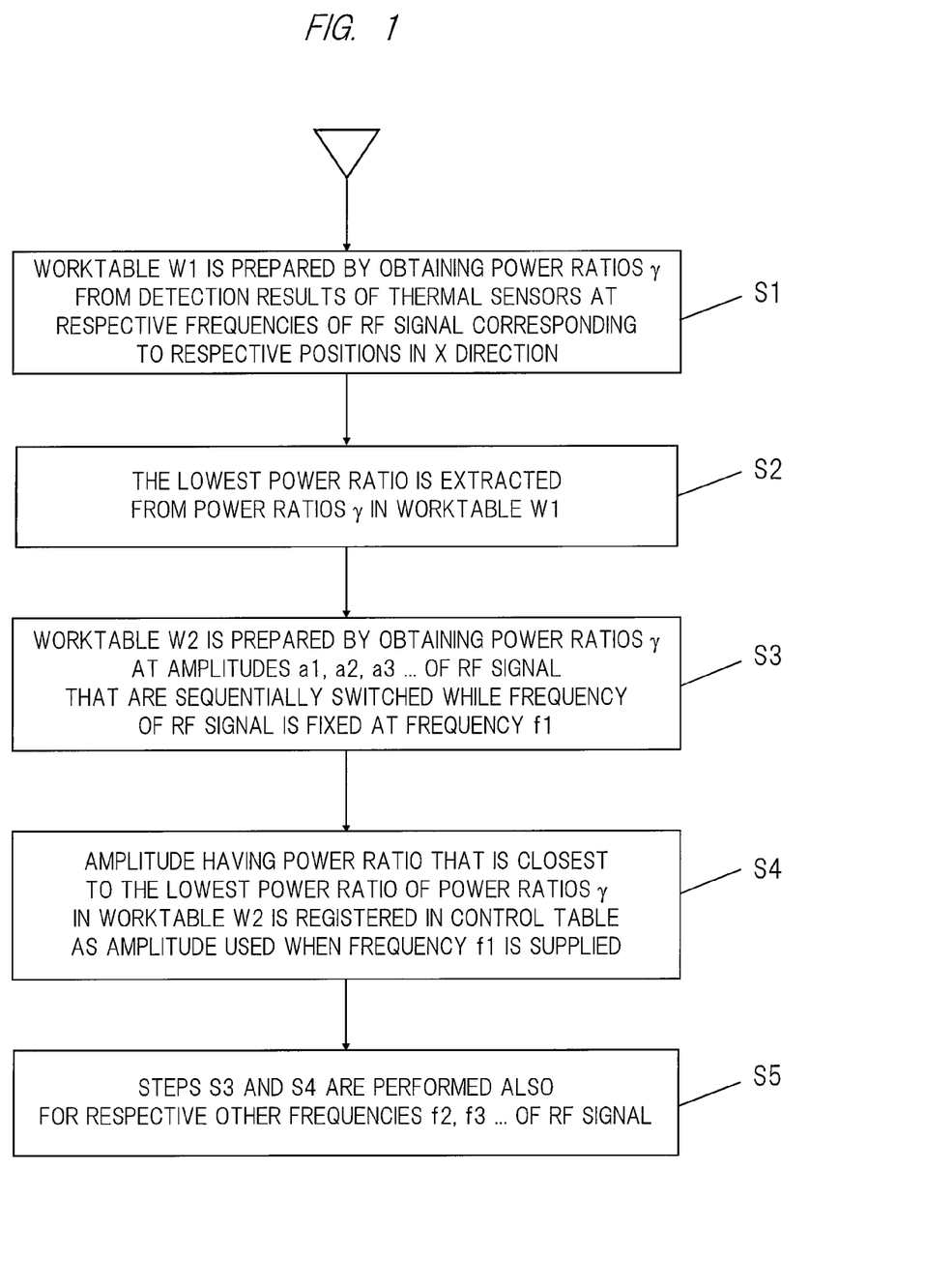
FIG. 1 is an outline flowchart showing an operation of a table preparation unit in a laser processing apparatus according to a first example of the present invention.

FIG. 1 is an outline flowchart showing an operation of the table preparation unit 18. A case of the preparation of the control table 12 of the X system will be described. However, the same goes for a case of the preparation of the control table 12 of the Y system. When it is assumed that frequencies of the RF signal to be supplied to the AOD of the X system in the positioning at positions x1, x2, x3 . . . in the X direction of FIG. 3 are set to f1, f2, f3 respectively, a frequency of the RF signal is sequentially switched to f1, f2, f3 . . . , and the detection signals of the thermal sensors 16 and 17 in the respective frequency cases are transmitted to the table preparation unit 18.

In the present example, it is assumed that the average power of the laser pulse L1 transmitted through the beam splitter 4 and detected by the thermal sensor 16 is 1/100 times the directly-detected average power of the laser pulse L1 because of a relation of the transmittance of the beam splitter 4. Accordingly, the table preparation unit 18 amplifies the detection value by the thermal sensor 16 by 100 times to obtain the average power "α" of the laser pulse L1, calculates a power ratio γ ((β/α) between a and the average power "β" of the laser pulse L4 detected by the thermal sensor 17, and registers the power ratio in a work table W1 (the step S1 of FIG. 1). A content of the work table W1 is shown in FIG. 5.

When the operation of the step S1 is performed, note that an amplitude obtained when the outgoing energy is maximized is used as the amplitude of the RF signal to be supplied to the AOD. In this manner, the amplitude to be supplied to the AOD may be determined on the basis of a previously-obtained relation among the frequency and the amplitude of the RF signal and the maximum outgoing energy.

Figure 5:
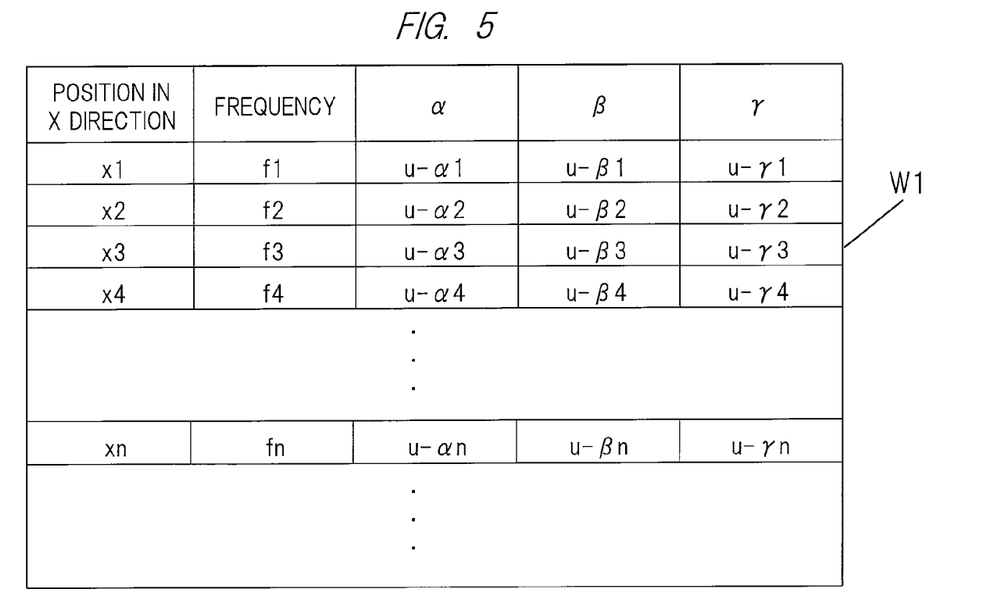
FIG. 5 is a diagram showing a content of one work table in the laser processing apparatus of FIG. 2.

In the work table W1 of FIG. 5, "u-α1", "u-α2", "u-α3" . . . indicate the average power α at the frequencies f1, f2, f3 . . . of the RF signal, respectively, "u-β1", "u-β2", "u-β3" . . . indicate the average power β at the frequencies f1, f2, f3 . . . of the RF signal, respectively, and "u-γ1", "u-γ2", "u-γ3" . . . indicate the power ratios γ at the frequencies f1, f2, f3 . . . of the RF signal, respectively.

A content of the work table W1 described here is shown for explaining a logic relation among the pieces of data. For example, the data indicating the positions x1, x2, x3 . . . in the X direction is not always registered for the frequencies f1, f2, f3 . . . of the RF signal, respectively. The same goes for a work table and a control table described below.

Next, the lowest power ratio (referred below to as the lowest power ratio) is extracted from the power ratios "u-γ1", "u-γ2", "u-γ3" . . . in the work table W1 (the step S2 of FIG. 1). In this description, the lowest power ratio is assumed to be "u-γn" at a frequency "fn" in the positioning at a position "xn" in the X direction. Next, the frequency of the RF signal is fixed at the frequency f1 obtained in the positioning at the position "x1" in the X direction while the amplitude of the RF signal is sequentially switched to a1, a2, a3 . . . that are sectioned within a controllable range, and the average power α, the average power β, and the power ratio γ (β/α) between them in these cases are registered in a work table W2 (the step S3 of FIG. 1). A content of the work table W2 is shown in FIG. 6.

Figure 6:
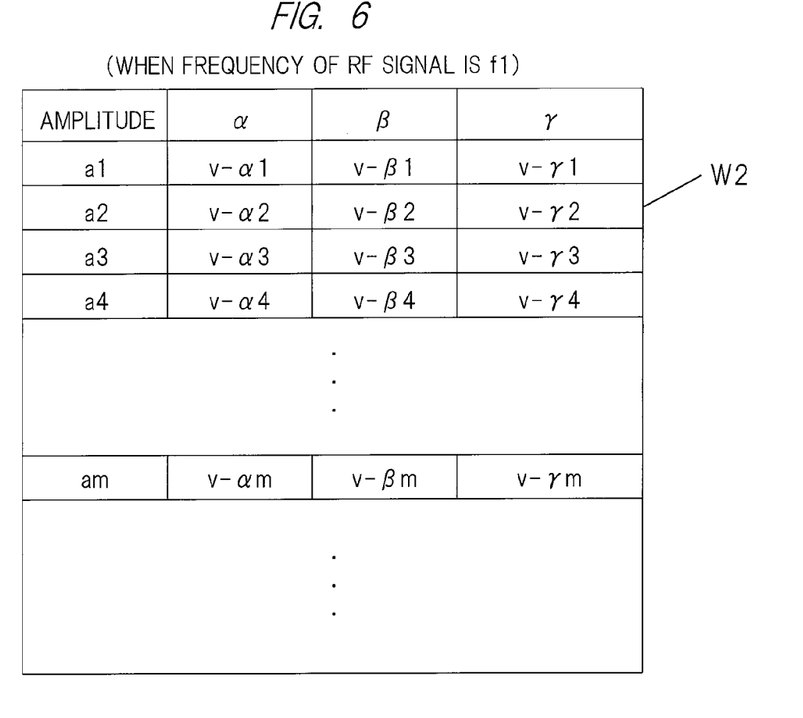
FIG. 6 is a diagram showing a content of another work table in the laser processing apparatus of FIG. 2.

In the work table W2 of FIG. 6, "v-α1", "v-α2", "v-α3" . . . indicate the average power α at the amplitudes a1, a2, a3 . . . of the RF signal, respectively, "v-β1", "v-β2", "v-β3" . . . indicate the average power β at the amplitudes a1, a2, a3 . . . of the RF signal, respectively, and "v-γ1", "v-γ2", "v-γ3" . . . indicate the power ratios γ at the amplitudes a1, a2, a3 . . . of the RF signal, respectively.

Next, a power ratio that is closest to the lowest power ratio "u-γn" is extracted from the power ratios "v-γ1", "v-γ2", "v-γ3" . . . in the work table W2. In this description, it is assumed that this power ratio is a power ratio "v-γn" at an amplitude "am" of the RF signal. The value "am" is registered in the control table 12 as an amplitude obtained when the frequency f1 of the RF signal is applied for the positioning at the position x1 in the X direction (the step S4 of FIG. 1).

Figure 7:
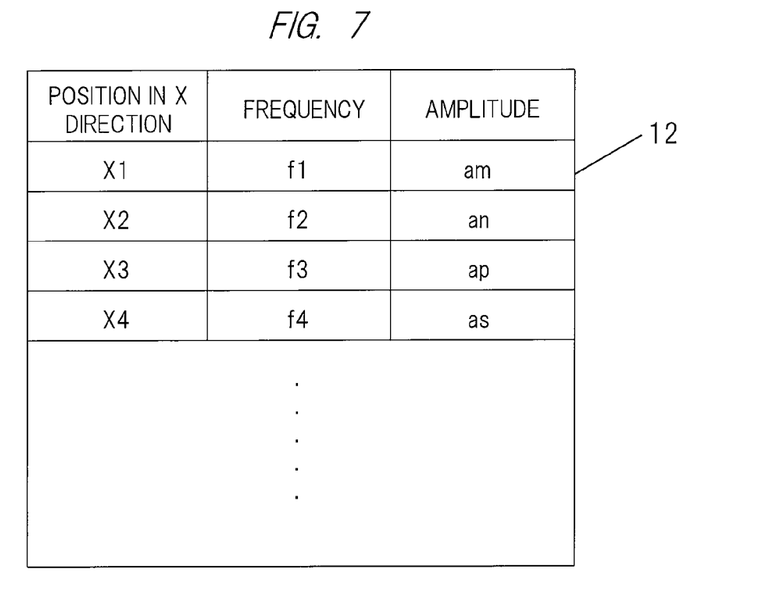
FIG. 7 is a diagram showing a content of a control table in the laser processing apparatus of FIG. 2.

Next, the steps 3 to 5 are performed to prepare the work table W2 and others also for each of the frequencies f2, f3 . . . for the positioning at other positions x2, x3 . . . in the X direction, and amplitudes "an", "ap", "as" . . . in these cases are registered in the control table 12 (the step S5 of FIG. 1). A content of the control table 12 completed as described above is shown in FIG. 7.

The control table 12 prepared as described above is used as described below. Although a case of the usage of the control table 12 of the X system will be described, the same goes for a case of the usage of the control table 12 of the Y system. In FIG. 2, when data for the positioning at the position x1 in the X direction is supplied to the AOD control unit 13, the AOD control unit 13 reads out the frequency f1 of and the amplitude am of the RF signal to be supplied from the control table 12 to the AOD, and supplies them to the AOD deflection unit 6. In this manner, from the AOD deflection unit 6, the laser pulse L2 having the deflection angle and the average power corresponding to the frequency f1 of and the amplitude am of the RF signal goes out to the galvano deflection unit 8. The same goes for cases of the positioning at the other positions x2, x3 . . . in the X direction.

According to the above-described example, the control table 12 is prepared on the basis of the power ratio between the average power α of the laser pulse L1 output from the laser oscillator 3 and the average power β of the laser pulse output from the collection lens 9. Therefore, even if the energy of the laser pulse output from the laser oscillator 3 accidentally increases or decreases, the influence of the increase/decrease can be eliminated, so that the hole quality can be ensured.

Second Example

When the work table W1 is prepared in the first example, each of the frequencies f1, f2, f3 . . . corresponding to the respective positions x1, x2, x3 . . . in the X direction are set as the frequencies of the RF signal to be supplied to the AOD, and the power ratios at these frequencies are obtained. However, the work table W1 may be prepared by setting, as the frequencies of the RF signal to be supplied to the AOD, center frequencies of respective frequency bands formed when the variation range of the frequencies is sectioned at a certain interval, and obtaining the power ratios (each referred below to as center power ratio) at these frequencies.

Figure 8:
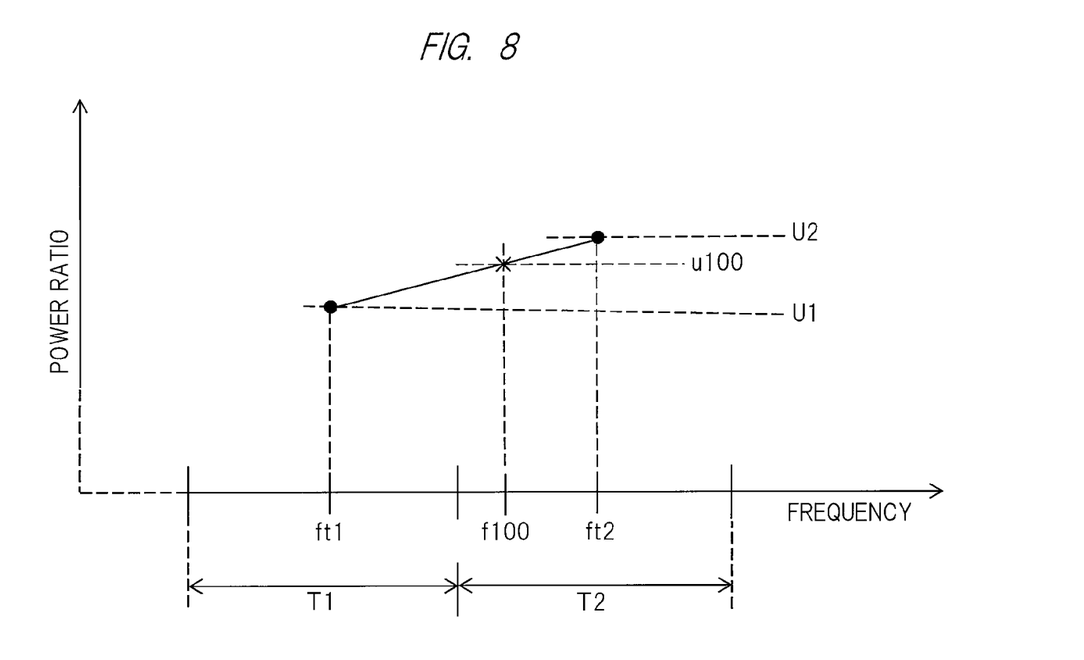
FIG. 8 is a diagram for explaining a second example of the present invention.

FIG. 8 is a diagram for explaining the above-described method. In FIG. 8, "T1" and "T2" are the frequency bands that are adjacent to each other, "ft1" and "ft2" are the center frequencies of the respective frequency bands T1 and T2, and "U1" and "U2" are the center power ratios at the respective center frequencies ft1 and ft2. In this method, the power ratios at the frequencies f1, f2, f3 corresponding to the respective positions x1, x2, x3 . . . in the X direction can be approximately obtained.

For example, a power ratio "U100" at a frequency "f100" corresponding to a position "x100" in the X direction is approximated so as to change in proportion to the frequency, and can be calculated by a formula "(f100−ft1)×(U2−U1)/(ft2−ft1)+U1" using data of f100, ft1, ft2, U1 and U2. The lowest power ratio in the variation range of the frequencies f1, f2, f3 . . . corresponding to the respective positions x1, x2, x3 . . . in the X direction may be extracted from the power ratios obtained as described above.

According to the above-described second example, it is unnecessary to obtain the power ratios at the frequencies f1, f2, f3 . . . corresponding to the respective positions x1, x2, x3 . . . in the X direction, and therefore, the number of entry items registered in the work table W1 can be reduced. The same goes for the Y direction as well if the center power ratios are similarly obtained at the center frequencies of the respective frequency bands formed by sectioning the variation range of the frequencies at a certain interval as similar to the X direction.

Third Example

When the work table W2 is prepared in the first example, the power ratios are obtained at the amplitudes a1, a2, a3 . . . of the RF signal to be supplied to the AOD that are sectioned in a controllable range. However, as similar to the case of the preparation of the work table W1 in the second example, the work table W2 may be prepared by setting center amplitudes at respective frequency bands obtained by sectioning a variation range of the amplitudes at a certain interval as the amplitudes of the RF signal to be supplied to the AOD, and obtaining the power ratios (each referred below to as amplitude center power ratio) at these amplitudes. The power ratios at the respective amplitudes a1, a2, a3 . . . of the RF signal can be approximately obtained on the basis of the center power ratios obtained at the respective frequency bands as similar to the case of the second example.

Figure 9:
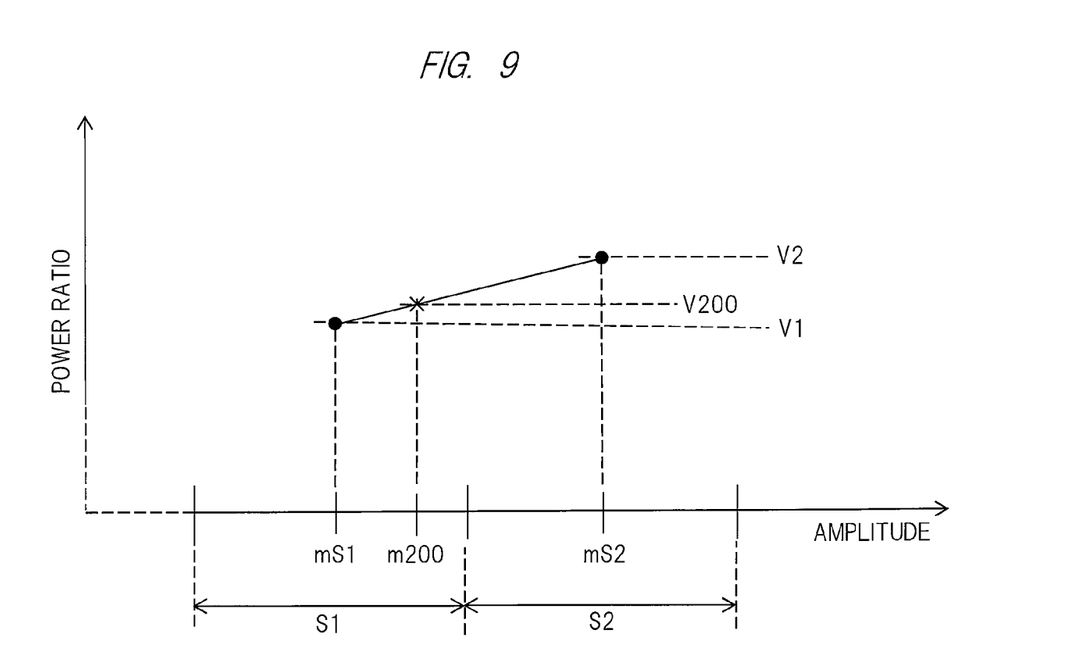
FIG. 9 is a diagram for explaining a third example of the present invention.

FIG. 9 is a diagram for explaining the above-described method. In FIG. 9, "S1" and "S2" are the amplitude bands that are adjacent to each other, "ms1" and "ms2" are the center amplitudes of the respective amplitude bands S1 and S2, and "V1" and "V2" are the amplitude center power ratios at the respective center amplitudes ms1 and ms2. In this method, the power ratios at the respective amplitudes a1, a2, a3 can be approximately obtained. For example, a power ratio "V200" at an amplitude "m200" is approximated so as to change in proportion to the amplitude, and can be calculated by a formula "(m200−ms1)×(V2−V1)(ms2−ms1)+V1" using data of m200, ms1, ms2, V1 and V2.

The amplitude having the power ratio that is closest to the lowest power ratio may be extracted on the basis of the power ratios obtained as described above. According to the above-described method, as similar to the case of the work table W1, the number of entry items registered in the work table W2 can be reduced.

Fourth Example

When the work table W2 is prepared in the third example, while the center amplitudes of the respective amplitude bands obtained by sectioning the variation range of the amplitudes at the certain interval are set as the amplitudes of the RF signal to be supplied to the AOD, the respective frequencies f1, f2, f3 . . . for the positioning at the positions x1, x2, x3 . . . are set as the frequencies of the RF signal to be supplied to the AOD. However, as similar to the second example, the variation range of the frequencies may be sectioned at a certain interval to obtain the center frequencies of the respective frequency bands.

Figure 10:
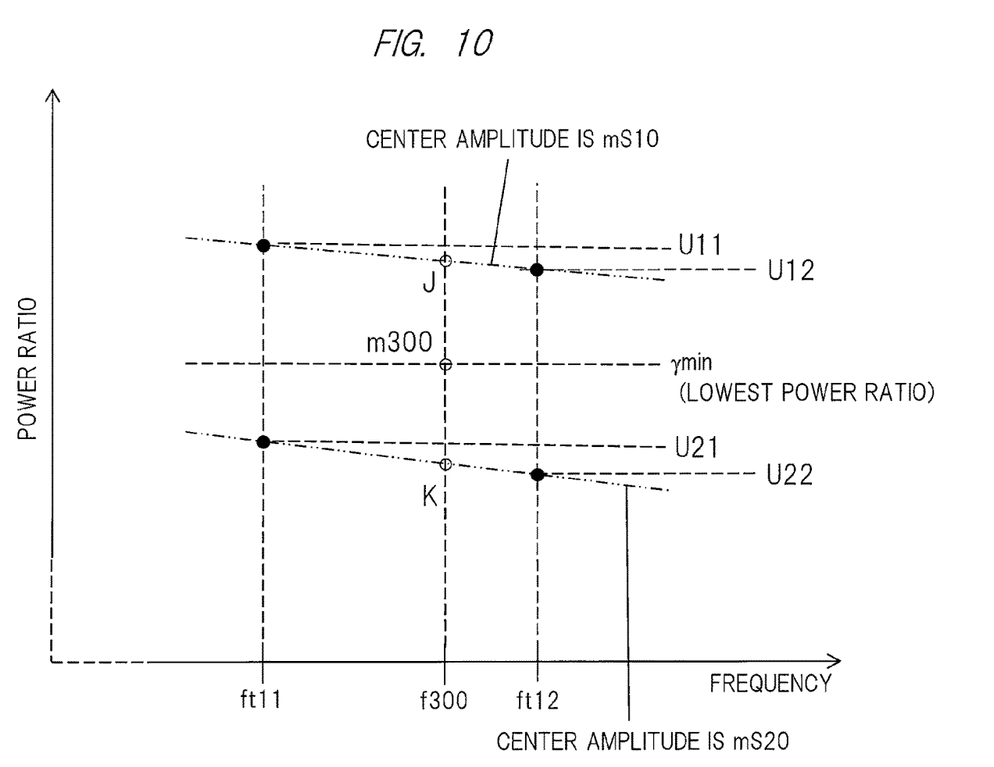
FIG. 10 is a diagram for explaining a fourth example of the present invention.

FIG. 10 is a diagram for explaining the above-described method. In FIG. 10, "ft11" and "ft12" are the center frequencies of the frequency bands that are adjacent to each other, "U11" and "U12" are the power ratios detected at the respective center frequencies ft11 and ft12 when the amplitude of the RF signal to be supplied to the AOD is the center amplitude "mS10", and "U21" and "U22" are the power ratios detected at the respective center frequencies ft11 and ft12 when the amplitude of the RF signal to be supplied to the AOD is the center amplitude "mS20".

The amplitude having the power ratio that is closest to the lowest power ratio may be approximately obtained as described below. For example, an amplitude "m300" having a power ratio at a frequency "f300" that is closest to the previously-obtained lowest power ratio "γmin" can be calculated by a formula "m300=mS20+(mS10−mS20)/(J−K)×γmin" using data of the power ratios U11, U12, U21 and U22 at the center amplitudes mS10 and mS20 in the frequency bands around the frequency f300. Note that a relation of "J=U11+(U12−U11)/(ft12−ft11)×f300" and a relation of "K=U21+(U22−U21)/(ft12−ft11)×f300" are established.

Fifth Example

Figure 11:
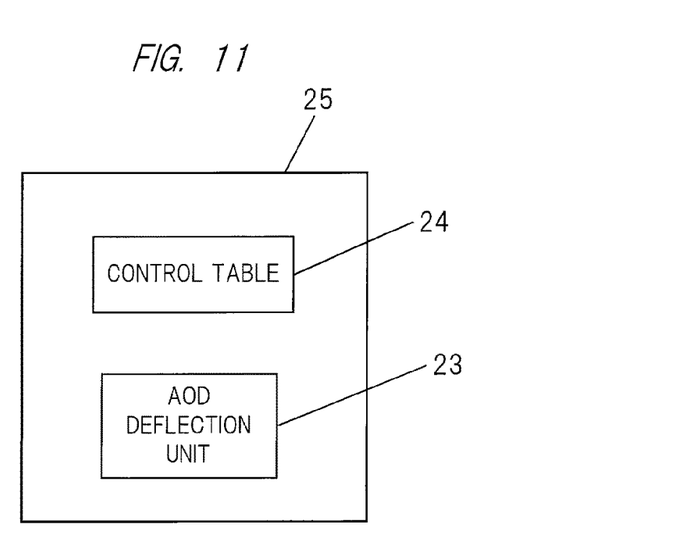
FIG. 11 is a diagram for explaining a fifth example of the present invention.

The above-described examples show the case of the preparation of the control table 12 of the AOD deflection unit 6 embedded in the laser processing apparatus. On the other hand, a different laser processing apparatus may be manufactured by embedding an AOD deflection unit 25 as a component instead of the AOD deflection unit 6 and the control table 12 in the laser processing apparatus of FIG. 2, the AOD deflection unit 25 having a set of an AOD deflection unit 23 having the same characteristics in terms of the frequency, the amplitude and the outgoing energy as those of the AOD deflection unit 6 and a control table 24 having the same contents as those of the control table 12 prepared as described in the above-described examples as shown in FIG. 11. In this manner, in the different laser processing apparatus, it is unnecessary to take time to prepare the control table, and therefore, the thermal sensors 16 and 17 and the table preparation unit 18 are also unnecessary.

What is claimed is:
1. A laser processing apparatus comprising:
an optical deflector configured to change a deflection direction of and outgoing energy of an incoming laser pulse by changes of a frequency of and an amplitude of a driving signal to be supplied; and
a controller configured to supply driving signals with amplitudes corresponding to respective frequencies;
wherein the laser processing apparatus is configured to process a workpiece by leading an outgoing laser pulse of the optical deflector to the workpiece and irradiating the workpiece with the outgoing laser pulse, and
the laser processing apparatus further includes:
a first detector configured to detect incoming energy of the incoming laser pulse; and
a second detector configured to detect the outgoing energy of the outgoing laser pulse,
wherein the controller is further configured to:
set the amplitude of a first driving signal to cause the largest outgoing energy, and recording the frequency of the first driving signal;
setting the frequency of another driving signal to be different from the frequency of the first driving signal; and obtain, at each of the frequencies, ratios of the outgoing energy detected by the second detector with respect to the incoming energy detected by the first detector for each frequency, obtain a ratio that is the lowest among the ratios obtained at each of the frequencies, determine an amplitude at each of the frequencies by obtaining, at each of the frequencies, ratios of the outgoing energy detected by the second detector with respect to the incoming energy detected by the first detector while changing the amplitude at each of the frequencies so as to search, at each of the frequencies, for an amplitude that produces the lowest ratio, and, when the workpiece is processed, supplies the driving signals to the optical deflector in accordance with the determined amplitude at each of the frequencies.

2. The laser processing apparatus according to claim 1, wherein the second detector detects the energy of the laser pulse with which the workpiece is really irradiated.

3. The laser processing apparatus according to claim 1, wherein the second optical deflector is further configured to deflect the laser pulse going out of the optical deflector.

4. The laser processing apparatus according to claim 1, wherein the contoller further includes a control table used for previously registering the determined amplitude at each of the frequencies.

5. A laser processing method processing a workpiece by leading an outgoing laser pulse of an optical deflector to the workpiece and irradiating the workpiece with the laser pulse by supplying driving signals to the optical deflector capable of changing a deflection direction of and outgoing energy of an incoming laser pulse by changes of the frequency of and the amplitude of the driving signal to be supplied, comprising the steps of:

arranging a first detector configured to detect incoming energy of the incoming laser pulse; and arranging a second detector configured to detect the outgoing energy of the outgoing laser pulse;

setting the amplitude of a driving signal to cause the largest outgoing energy, and setting the frequency of another driving signal;

obtaining, at each of the frequencies, ratios of the outgoing energy detected by a second detector with respect to the incoming energy detected by the first detector for each of the frequencies;

determining a ratio that is the lowest ratio among the ratios obtained at each of the frequencies;

determining an amplitude at each of the frequencies by obtaining, at each of the frequencies, ratios of the outgoing energy detected by the second detector with respect to the incoming energy detected by the first detector while changing the amplitude at each of the frequencies so as to search, at each of the frequencies, for an amplitude that produces the lowest ratio; and, when the workpiece is processed, supplying the driving signals to the optical deflector in accordance with the determined amplitude at each of the frequencies.

\* \* \* \* \*